United States Patent
Krech, Jr. et al.

(10) Patent No.: US 6,763,490 B1
(45) Date of Patent: Jul. 13, 2004

(54) METHOD AND APPARATUS FOR COORDINATING PROGRAM EXECUTION IN A SITE CONTROLLER WITH PATTERN EXECUTION IN A TESTER

(75) Inventors: Alan S Krech, Jr., Fort Collins, CO (US); John M Freeseman, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 691 days.

(21) Appl. No.: 09/669,262

(22) Filed: Sep. 25, 2000

(51) Int. Cl.[7] ............................ G01R 31/28; G06F 11/00
(52) U.S. Cl. ............................ 714/738; 714/34; 714/35; 702/118; 712/245
(58) Field of Search .......................... 714/738, 724, 714/718, 736, 743, 734, 32, 742, 744, 30, 31, 735, 25, 34, 33; 324/73.1, 158.1; 365/201, 230.03; 702/118; 716/4; 712/227, 245, 244

(56) References Cited

U.S. PATENT DOCUMENTS

| | | | | |
|---|---|---|---|---|
| 4,402,081 A | * | 8/1983 | Ichimiya et al. ............ | 714/718 |
| 4,875,210 A | * | 10/1989 | Russo et al. ................. | 714/743 |
| 5,740,413 A | * | 4/1998 | Alpert et al. ................ | 712/227 |
| 5,781,718 A | * | 7/1998 | Nguyen ........................ | 714/33 |
| 5,951,705 A | * | 9/1999 | Arkin et al. ................. | 714/738 |
| 6,014,764 A | * | 1/2000 | Graeve et al. ............... | 714/738 |
| 6,591,385 B1 | * | 7/2003 | Krech et al. ................. | 714/718 |
| 6,598,112 B1 | * | 7/2003 | Jordan et al. ................. | 711/2 |
| 2002/0152427 A1 | * | 10/2002 | Ok ............................... | 714/34 |
| 2002/0157042 A1 | * | 10/2002 | Krech et al. .................. | 714/45 |
| 2002/0162046 A1 | * | 10/2002 | Krech et al. .................... | 714/5 |
| 2003/0005375 A1 | * | 1/2003 | Krech et al. ................. | 714/724 |

OTHER PUBLICATIONS

"Frozen State for Computer Program", IBM Technical Disclosure Bulletin, Sep. 1, 1974, NN74091066, pp 1066–1067.*

* cited by examiner

Primary Examiner—Albert Decady
Assistant Examiner—John P. Trimmings

(57) ABSTRACT

A method and apparatus for coordinating program execution in a site controller with pattern execution in a tester executes the pattern in the tester and a pattern interruption instruction. The pattern interruption instruction causes the tester to write to a service request register in the site controller specifying a value that specifies a requested subroutine and a data source. The site controller initiates execution of the requested subroutine in the site controller using the specified data source.

21 Claims, 6 Drawing Sheets

METHOD AND APPARATUS FOR COORDINATING PROGRAM EXECUTION IN A SITE CONTROLLER WITH PATTERN EXECUTION IN A TESTER

BACKGROUND

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT, and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is convention to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

It is beneficial to have multiple components in a memory tester for purposes of efficient execution of various tasks. As an example, memory tester tasks may be coarsely divided into three basic tasks that include functional testing at speed, data gathering and decision processing, and robotics control and data reporting. As between the functional testing task and the data gathering and decision-processing task, the two tasks must share information, but by and large the tasks themselves may be performed independently. The separate components in the testers that perform these tasks are optimized for each of the task types. There is significant capability and configurability in each component, however, making it possible to perform some of the tasks in either component. Depending upon the specific application, one of the components is probably either better suited to perform a task at hand, more convenient to use for the task, or otherwise preferred by a test developer. Accordingly, there is a need for a method and apparatus to permit selection of the specific component to perform any one task and a method and apparatus for coordinating the execution and interaction of the different tasks. During development and debug operations, it is also beneficial to be able to have control over the start and stop of tester operations. In prior art testers, a single step function permitted executing a single vector or instruction at a time. For purposes of the present disclosure, the term "vector" is used to reference a parallel group of 1's and 0's applied to drive or receive channels connected to the DUT 14. The term "instruction" is used to reference a line of software executed by a sequencer 19 in the tester 6. "Vector" and "instruction" are used interchangeably because each instruction executed generates a vector that is applied to the DUT. Because testing at speed is an important feature of any tester and execution of only one vector at a time can be a slow and laborious process, single stepping is of limited assistance. It is more desirable to retain the ability to drive and receive vectors to and from the DUT at speed, while also having the ability to pause vector application at will. There is a need, therefore, for a limited continue operation permitting one component to step through the execution of portions of a task without sacrificing the ability to functionally test at speed between the start and stop points.

SUMMARY

A method of coordinating program execution in a site controller with pattern execution in a tester executes the pattern in the tester processor, and executes a pattern interruption instruction. The pattern interruption instruction causes the tester to write to a service request register in the site controller specifying a requested subroutine and a data source. The site controller then initiates execution of the requested subroutine in the site controller.

An apparatus for coordinating program execution comprises a site controller executing a routine and a tester executing a pattern. A bus interconnects the site controller and the tester. A write to a trigger register in the tester by the site controller initiates execution of the pattern in the tester and write to at least one program register in the site controller that specifies the routine for execution in the site controller.

DETAILED DESCRIPTION

Figure 1:
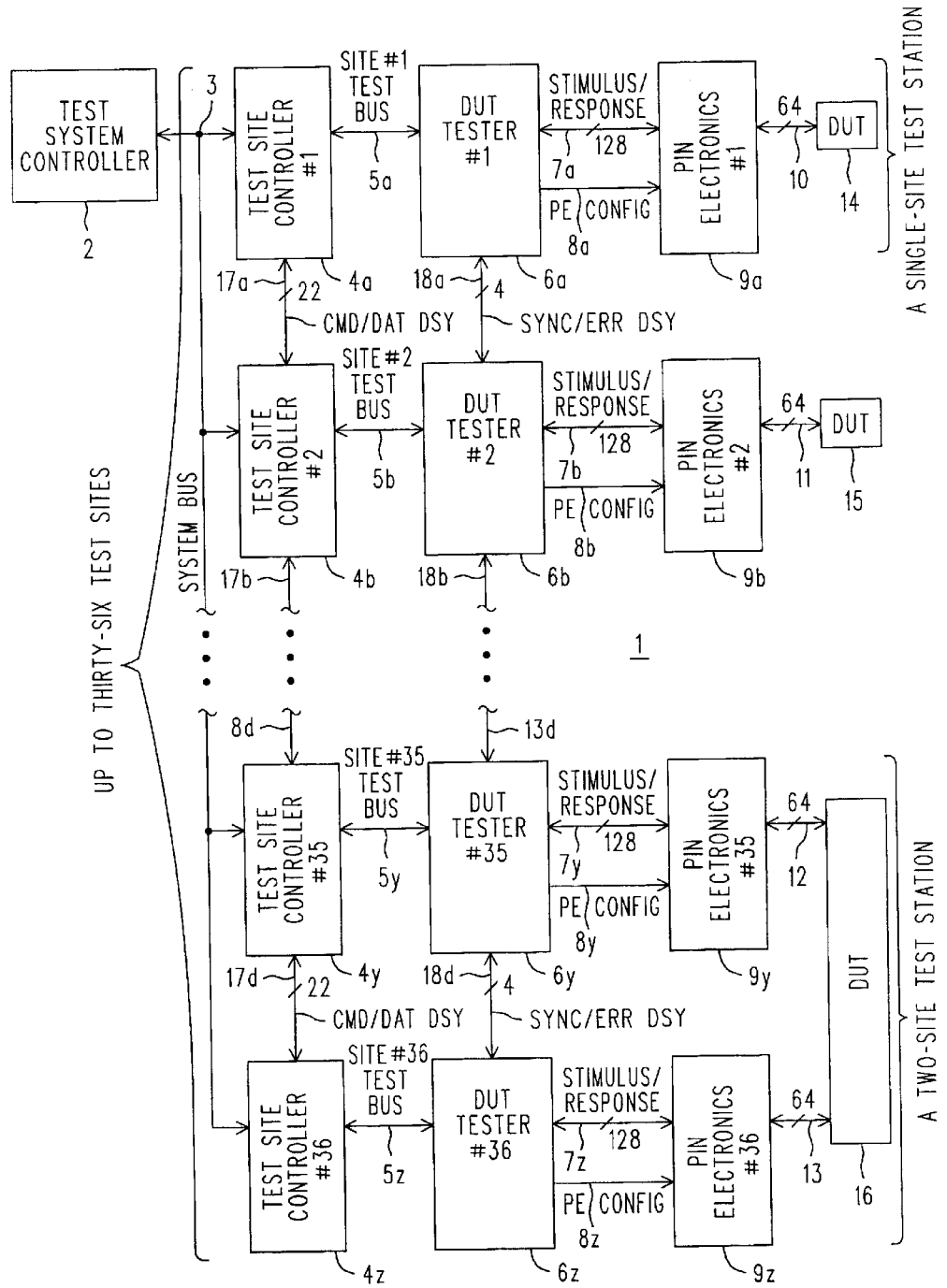
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies , clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing a suitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT. At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller #1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named Oust as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17a–d that we have been discussing exist between the various Test Site Controllers 4a–4z. There is a similar arrangement for the SYNC/ERR DSY 18a–18d and the DUT Testers 6a–6z. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
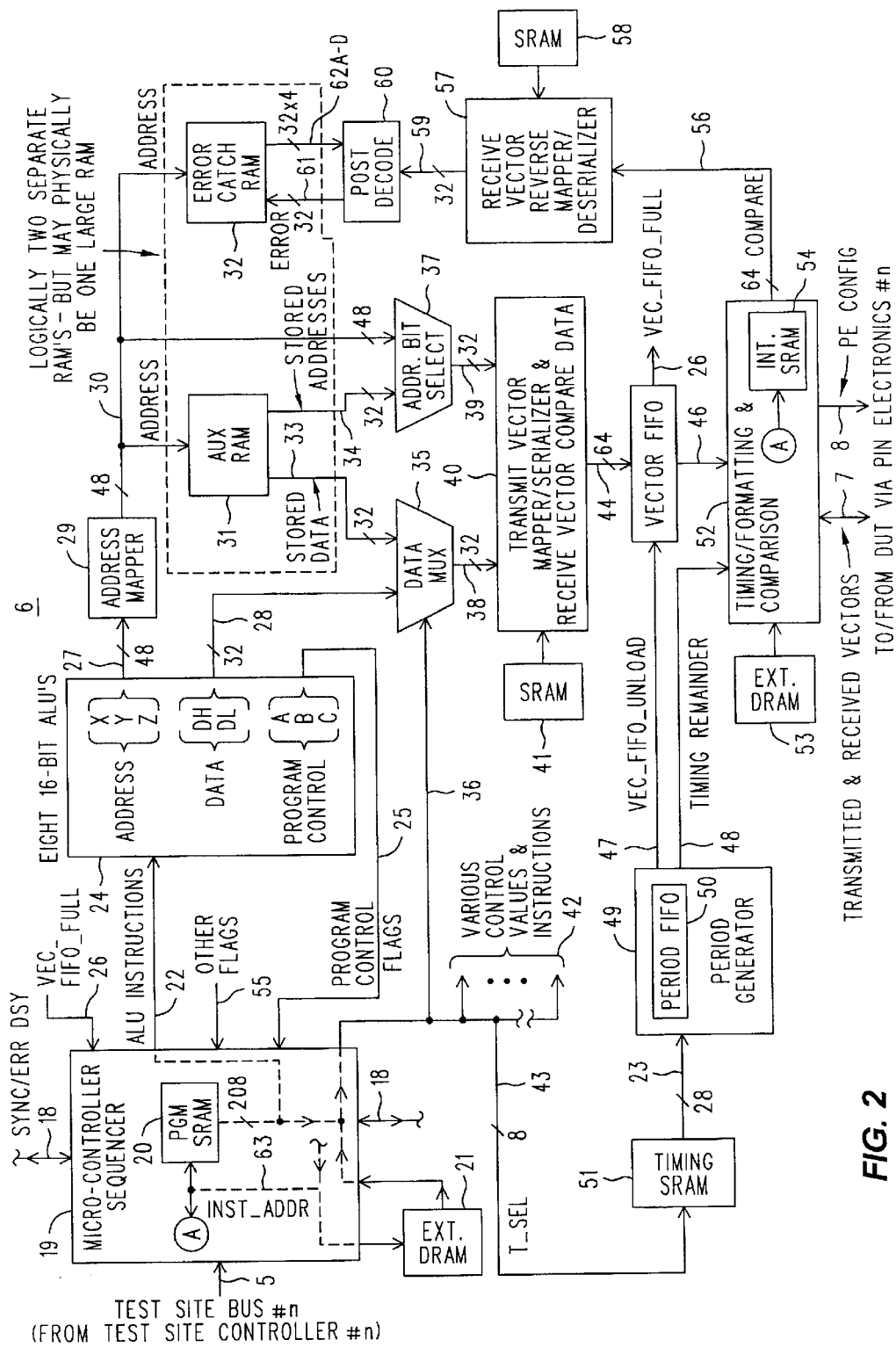
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 19 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry. This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.)

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 33) to present as its output 38, which is then applied as one of two vector components to a Transmit Vector Mapper/Serializer/Receive Vector Compare Data Circuit 40 (the other component is the output 39 of the Addr. Bit Select circuit 37). Circuit 40 ca n perform three functions: assemble vector components (38, 39) into an ordered logical representation of an entire vector that is to be applied (transmitted) to the DUT; apply an. arbitrary dynamic correspondence (mapping) between the ordered bits of the logical representation of the transmit vector and the actual physical channel number of the Pin Electronics (i.e., which probe tip). will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19. The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics. That is, each instance of Pin Electronics receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Both the test site controller 4 and the DUT tester 6 have capabilities for executing various instructions. The test site controller is optimized for tasks involving mathematical calculations and data management and has significantly more memory available to it than the DUT tester 6. The test site controller 4 issues commands to the DUT tester 6 to execute certain user developed test patterns and then receives information from the DUT tester 6 regarding results of the test pattern. As an example, in the case of FLASH memory test, the test site controller 4 uses the results information to perform redundancy analysis and repair decisions on the devices under test. The test site controller uses an Intel i960 microprocessor and the DUT tester 6 has an application specific integrated circuit to perform its tasks. The processor in the DUT tester 6 is optimized for executing test patterns that algorithmically generate vectors, and drive and receive signals according to those vectors to and from the DUT 14 at speed. There are instances, however, when an operation on the DUT tester 6 requires calculating certain parameters for use in the operation. If the calculation requires multiple operations and decisions or uses large tables of data, it may be more efficient overall for the DUT tester 6 to make a request to the test site controller 4 to perform the required calculation and then return one or more status flags or pieces of data that are used by the DUT tester 6. The request from the DUT tester 6 to execute a routine in the test site controller 4 is termed a "sequencer atomic". There are two types. In a "keep alive" type of sequencer atomic, the DUT tester 6 requests execution of a routine and then continues to execute the current test pattern in the DUT tester 6. In a "break" type of sequencer atomic, the current test pattern execution in the DUT tester 6 is paused while the test site controller 4 executes the requested routine. When the break type sequencer atomic is executed, the DUT tester 6 retains context information in various administrative registers. Accordingly, when the test site controller 4 is finished its operations, it can issue a continue command. Because the DUT tester 6 retains the context information, it can literally continue from where it left off. In the case of the keep alive type of sequencer atomic, the DUT tester 6 requests execution of the routine by the test site controller 4 and then continues with execution of the current test pattern. When the test site controller 4 has finished the calculation, it may set status registers to signal its completion and a status of completion to the DUT tester 6. The DUT tester 6 may poll the status registers and perform a conditional branch based upon their values. The same capability permitting continuation of the current test pattern in the DUT tester 6 also permits a "limited continue" operation. The limited continue operation permits a test developer to specify a number of sequencer instructions to execute before pausing. Advantageously, the specified number of sequencer instructions is performed at speed. This permits a test developer to pause at points in the current test pattern that help illuminate the areas of interest for debug purposes without sacrificing the ability to exercise the DUT 14 at the appropriate vector speed.

Figure 3:
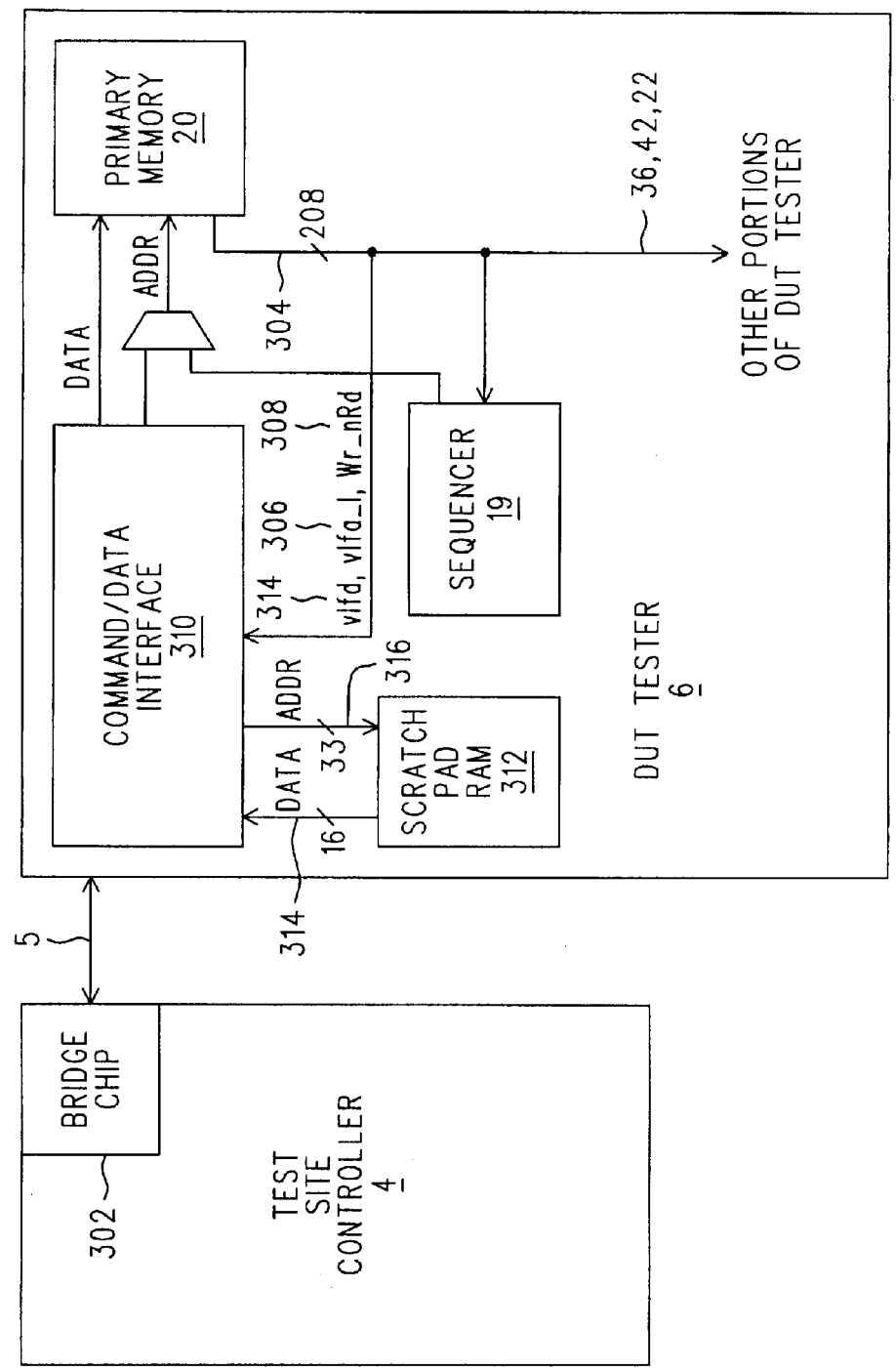
FIG. 3 is a simplified block diagram of those components in the test site controller 4 and DUT tester 6 that are relevant to the selection and coordination of task processing.
Figure 4:
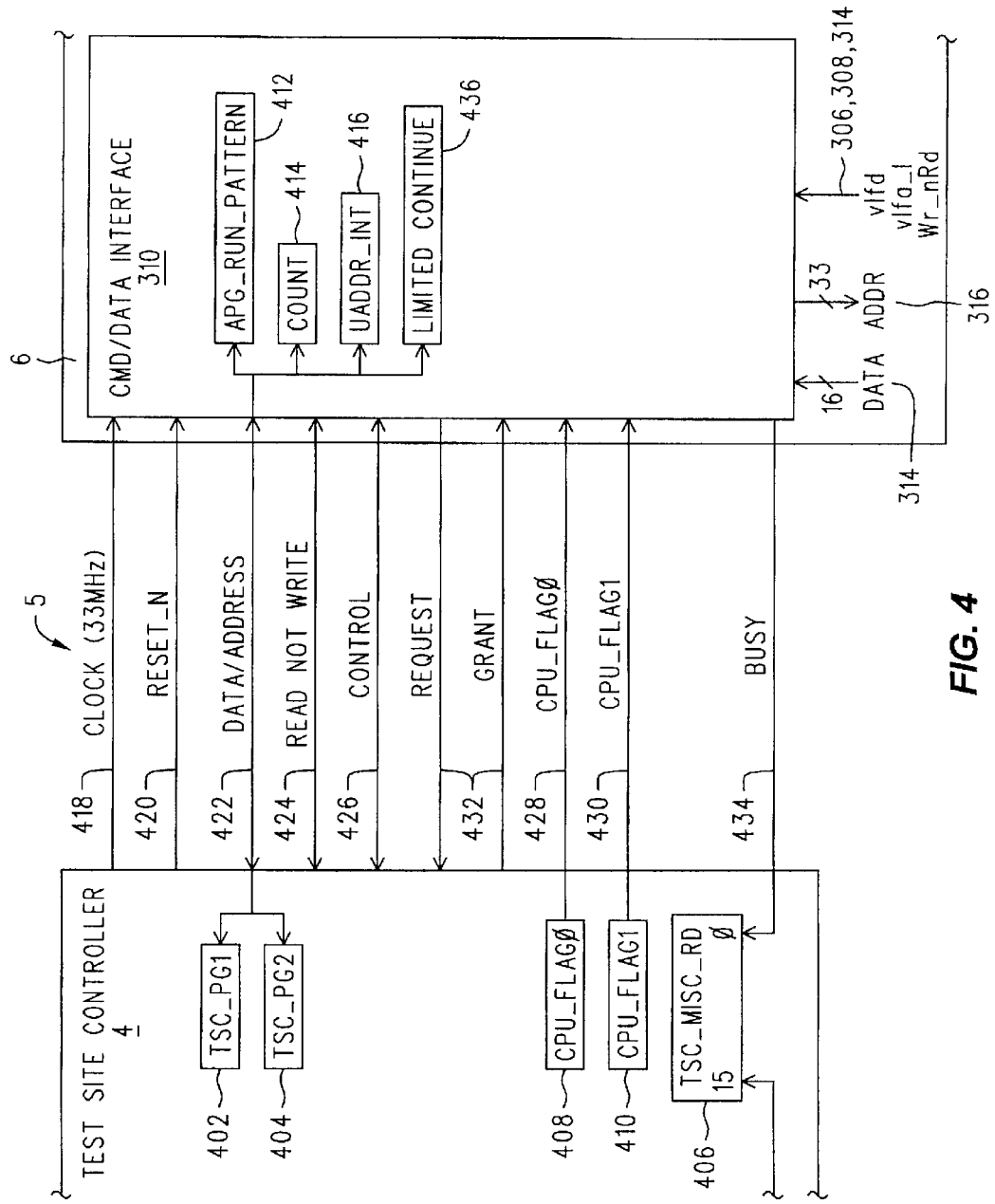
FIG. 4 is a simplified block diagram illustrating additional details for the test bus.

With specific reference to FIGS. 3 and 4 of the drawings, there is shown a representative site showing components of the test site controller 4 and the DUT tester 6 with the test bus 5 connecting the two elements. The alphabetic designations as suffixes of the reference numerals that were previously used in this detailed description are dropped to indicate that FIGS. 3 and 4 are representative of all of the thirty-six sites illustrated in FIG. 1 of the drawings. The test site controller 4 has the i960 processor and a bridge chip 302 that handles the test bus 5 protocols. The bridge chip is a field programmable gate array that performs communication and protocol functions for the test site controller 4. The test site controller 4 also has two service request registers, a 16-bit TSC_PG1 register 402 and a 16-bit TSC_PG2 register 404. There is also a 16-bit TSC_MISC_RD register 406, and two status registers, CPU_FLAG0 408 and CPU_FLAG1 410. The DUT tester 6 has the sequencer 19, primary memory 20, a command/data interface 310, and a scratch pad memory 312. During DUT tester test pattern execution, the sequencer 19 addresses locations in the primary memory 20. The primary memory 20 has a 208-bit wide instruction word 304, a portion of which is fetched and executed directly by the sequencer 19. Remaining bits of the instruction word 304 are connected to various other portions of the DUT tester 6 for specific operations in conjunction with execution of the instructions by the sequencer 19. A portion of the remaining bits in the instruction word 304 is connected to the command/data interface 310. The command/data interface 310 is responsible for communications between the bridge chip 302 in the test site controller 4 and the DUT tester 6 over the test bus 5. A 16-bit vlfa_1 field 306, a 16-bit vlfd field 314, and a Rd_notWr(read not write) bit 308 in the instruction word 304 are connected to the command/data interface 310 and support a programmed read or write operation between the DUT tester 6 and the test site controller 4 and within the DUT tester 6. Within the current test pattern, the sequencer 19 supports calls to subroutines and returns from the called subroutines upon their completion. Accordingly, the sequencer 19 maintains a subroutine call stack. The sequencer 19 also maintains other test pattern context information such as a vector pipeline, pipeline depth, error flags, and other context dependent information.

With specific reference to FIG. 4 of the drawings, there is shown additional detail concerning the test bus 5 and registers in the test site controller 4 and the DUT tester 6 that support communication between the two components. The test bus 5 further comprises a 33 MHz clock line 418 that determines the speed of the test bus 5. A reset_n line 420 is an active low line that causes the test bus to be cleared of all current operations and restored to a default condition. A 16-bit bi-directional data/address bus 422 and a read not write signal bit 424 perform the programmed I/O reads and writes. Three bi-directional control lines 426 perform operations that are unused in the method that is the subject of the present invention. A cpu flag0 signal line 428 and a cpu flag1 signal line 430 reflect the contents of the CPU_FLAG0 and CPU_FLAG1 registers 408, 410 in the test site controller 4. Request and grant signal lines 432 permit the DUT tester 6 to request control of the test bus 5 and then accept control once control is granted by the test site controller 4. Typically, the test site controller 4 holds control of the test bus 5. When a test pattern is running on the DUT tester 6, the DUT tester 6 requests control of the test bus 5 to perform a programmed I/O write as in the case of the call to a sequencer atomic. After the DUT tester 6 has performed the function that prompted it to request test bus control, it releases control and control returns to the test site controller 4. Additionally, when a test pattern is running, the DUT tester 6 sets a busy signal line 434. The value on the busy signal line 434 is stored into bit 0 of the TSC_MISC_RD register 406, which is available for polling by the test site controller 4. Writing values to the TSC_PG 1 and TSC_PG2 registers 402, 404 sets bit 15 of the TSC_MISC_RD register 406 and reading the TSC_PG2 register 404 clears bit 15 in the TSC_MISC_RD register 406. Accordingly, a one(1) value in bit 15 of the TSC_MISC_RD register 406 indicates to the test site controller 4 that an atomic has been called by the DUT tester 6 and a zero(0) value indicates that an atomic has not been called since the most recent read of the TSC_PG1 and TSC_PG2 registers 402, 404. Note that remaining bits 1 through 14 of the TSC_MISC_RD register 406 are used for purposes not relevant to the present invention. Writing values to the TSC_PG1 and TSC_PG2 registers 402,404 also clears both of the CPU_FLAG0 and CPU_FLAG1 registers 408,410. Clearing of the CPU_FLAG0 and CPU_FLAG1 registers 408,410 is reflected in the cpu flag0 and cpu_flag1 signal lines 428,430. The test site controller 4 may then write to the CPU_FLAG0 and CPU_FLAG1 registers 408,410 at any point during execution of the test program that is running on the test site controller 4. The cpu flag 0 and cpu flag1 signal lines 428, 430 may merely indicate the test site controllers 4 completion of the requested routine or the test pattern may be programmed to branch conditionally depending upon which one or both of the cpu flag0 and cpu FLAG1 signal lines 428, 430 are set.

The command/data interface 310 in the DUT tester 6 has an APG_RUN_PATTERN register 412, and a UADDR_INT register 416. The test site controller 4 initiates execution of a test pattern in the DUT tester by writing a value to the APG_RUN_PATTERN register 412. The write of a zero(0) value to the APG_RUN_PATTERN register 412 causes the sequencer 19 in the DUT tester 6 to clear the current context information and initiate execution of a test pattern beginning at a memory location designated by a value in the UADDR_INT register 416. The test site controller 4 must begin execution of a new test pattern by writing to the UADDR_INT register 416 prior to writing to the APG_RUN_PATTERN register 412. A write of a one(1) value to the APG_RUN_PATTERN register 412 retains the current context information and continues execution of the current test pattern. In the case of continued execution, the test site controller 4 typically writes to the APG_RUN_PATTERN register 412 without changing the UADD_INT register 416. It is, however, up to the test developer to program the write or not. When the new or continued test pattern begins execution, the DUT tester 6 sets the busy signal line 434, which is reflected in the bit 0 of the TSC_MISC_RD register 406. Typically, the test site controller 4 is standing idle polling bits 0 and 15 of the TSC_MISC_RD register 406 waiting for the DUT tester 6 to either complete the current test pattern or call one of the atomics. When the DUT tester 6 executes a program instruction that includes one of the atomic calls, the command/data interface 310 accepts values in the 16-bit vlfd field 314, 16-bit vlfa_1 field 306, and the Rd_notWr(read not write) bit in the program instruction word. The command/data interface 310 toggles the read not write signal line 424 and writes the value in the vlfd field 314 to the TSC_PG2 register 404. The command/data interface 310 then writes the vlfa_1 field 306 to the TSC_PG1 register 402. Writing to the TSC_PG1 and TSC_PG2 registers 402,404 sets the bit 15 of the TSC_MISC_RD register 406 and clear the CPU_FLAG0 and the CPU_FLAG1 registers 408, 410. If the atomic were a keep alive type, the busy signal line 434 is active and bit 0 of the TSC_MISC_RD register 406 is set. Setting the bit 15 of the TSC_MISC_RD register 406 causes the test site controller 4 to read the TSC_PG1 and TSC_PG2 registers 402, 404. The test site controller 4 then performs those tasks it is programmed to perform based upon the values read from the TSC_PG1 and TSC_PG2 registers 402, 404. The test site controller 4 may set either or both of the CPU$_{FLAG0\ and\ the}$ $_{CPU}$_FLAG1 registers 408, 410 during or after completion of the requested routine for purposes of signaling to the DUT tester 6. The test pattern may be programmed to execute conditional branches based upon the state of the cpu flag 0 and cpu flag1 status lines 428, 430.

The test site controller 4 may alternatively cause test pattern execution by writing to a COUNT register 414 directly for purposes of initiating the limited continue operation. A write to the COUNT register 414 from the test site controller 4 sets a limited continue status register 436 in the command/data interface 310 and initiates execution of a number of instructions indicated by the value written to the COUNT register 414. A write to the COUNT register 414 does not clear any of the context information and execution of the limited continue operation begins with a fetch by the sequencer 19 of the instruction word located in the memory location specified in the UADDR_INT register 416. During the execution of the test pattern, the DUT tester 6 sets the busy signal line 434 and clears it upon completion of the number of program instructions specified in the COUNT register 414. Because the busy signal line 434 indicates to the test site controller 4 that the DUT tester 6 is idle, the test site controller 4 is at liberty to start a new test pattern, continue an existing test pattern (i.e. one in which the DUT tester 6 is maintaining context information), or initiate another limited continue operation. Upon reaching the specified value in the COUNT register 414, proper application requires that all vectors that are in the pipeline as a result of the limited continue operation are flushed and applied to the DUT 14 before the limited continue operation is complete. In order to properly synchronize and only apply those vectors in the pipeline up to and including the last instruction executed by the sequencer 19, there are two pipeline control lines that are part of the various control values and instructions 42 shown in FIG. 2. Although not shown in the Figure, the two pipeline control lines 42 connect directly to the timing/formatting and comparison element 52. A "00" value on the two pipeline control lines 42 indicates to the timing/formatting and comparison element 52 that a vector should not be applied to the DUT 14. Accordingly, in a limited continue operation, the pipeline control lines 42 permit application of only the limited continue vectors to the DUT 14. Typically, there are extra cycles required to completely administer all operations on the vectors in the pipeline and complete the limited continue operation. It is not desirable, however, to continue applying vectors to the DUT 14 during the extra administration cycles. Accordingly, the pipeline control lines 42 are used to permit operation of the extra administration cycles without applying unintended vectors to the DUT 14.

The components disclosed in the above paragraph provide the capability to coordinate execution of tasks between the test site controller 4 and the DUT tester 6. The command/data interface 310 in the DUT tester 6 may also access the scratch pad RAM 312 via scratch pad address and data lines 314, 316. The scratch pad RAM 312 may be written to or read from either the test site controller 4 or the DUT tester 6. One application of this capability is sharing of data between the test site controller 4 and the DUT tester 6. For example, the DUT tester 6 may write to the scratch pad RAM 312 and then request execution of a routine in the test site controller 4 with the scratch pad RAM 312 as a source of data for use in the requested routine.

Figure 5:
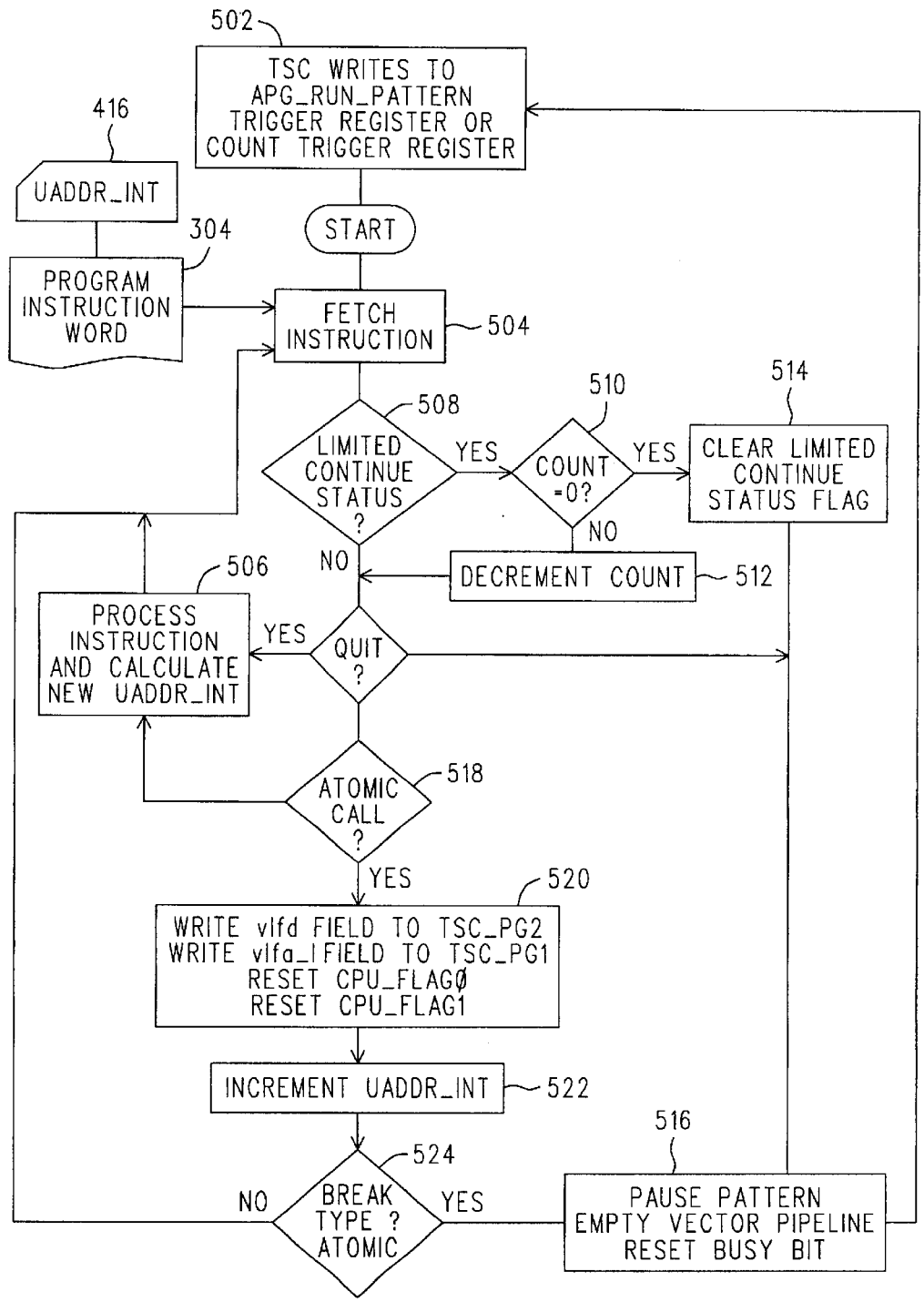
FIG. 5 is a flow chart of a DUT tester 6 process according to the teachings of the present invention.

With specific reference to FIG. 5 of the drawings, a method according to the teachings of the present invention begins at reference numeral 502 with an idle DUT tester 6 and a test program running on the test site controller 4. At some point in the test program, the test site controller 4 initiates execution of a test pattern by writing a value to the UADDR_INT register 416 which points to the first instruction of the test pattern in the primary memory 20 and then writing a zero (0) value to the RUN_APG_PATTERN register 412. The zero(0) value causes the DUT tester 6 to clear the existing context information and begin the test pattern execution. When the APG_RUN_PATTERN register 412 is written, the DUT tester 6 begins test pattern execution with a fetch operation by the sequencer 19 of the program instruction word 304 located in the primary memory 20 at the address location specified by the UADDR_INT register 416 shown at reference numeral 504. The sequencer 19 comprises a state machine for executing any one of a number of available instructions. The state machine is a plurality of interconnected gates making up the ASIC that is part of the DUT tester 6, but is described herein in terms of the process it performs. The sequencer 19 first determines the type of instruction it is to execute. Conceptually, the sequencer 19 determination process comprises a series of "if . . . then" statements. The present patent application is directed to a method and apparatus for process coordination between the test site controller 4 and the DUT tester 6. Other instructions and the processes they perform are not discussed herein and are shown generally at reference numeral 506.

In the case of limited continue operations, the test site controller 4 writes a value to the COUNT register 414 specifying the number of vectors or instructions that are to be executed without pause and then initiates execution of the current test pattern in the limited continue mode. The method checks the limited continue status register 436 at 508 and if the DUT tester 6 is in the limited continue mode, the method then checks the value in the COUNT register 414. The sequencer 19 checks the COUNT register 414 to determine if it has reached a zero (0) value. See reference numeral 510. If it has not, the COUNT register 414 is decremented at reference numeral 512, and if the fetched instruction word is not a sequencer atomic or a quit instruction, the sequencer 19 executes the current instruction, calculates the next value in the UADDR_INT register 416 at 506, and then fetches the next instruction word at 504. If the COUNT register 414 is a zero (0) value, the limited continue operation is complete and the limited continue status flag is cleared at 514, the current test pattern is paused, an existing vector pipeline is flushed of all vectors that are in process at 516. The busy signal 434 is reset which writes a zero(0) to bit 0 of the TSC_MISC_RD register 406 to indicate that the DUT tester 6 is idle. The test site controller 4 may poll the TSC_MISC_RD register 406 to determine whether and when the DUT tester 6 is idle. Upon completion of the limited continue operation, the busy signal 434 indicates an idle DUT tester 6, the test site controller 4 may then perform other instructions and debug operations. The test site controller 4 may perform multiple limited continue operations by executing sequential instructions that write values to the COUNT register 414 and initiate a new limited continue operation by setting the limited continue register in the command/data interface 310.

If the sequencer instruction is one of the sequencer atomics, either keep alive or break type at 518, the sequencer 19 directs the command/data interface 310 to write the vlfd field 314 in the program instruction word 304 to the TSC_PG2 register 404 and the vlfa_1 field to the TSC_PG1 register 402. Writing to the TSC_PG1 and TSC_PG2 registers 402,404 clears the CPU_FLAG0 and CPU_FLAG1 status registers. See reference numeral 520. The sequencer 19 then increments the UADDR_INT register 416 at reference numeral 522. If the sequencer atomic is a keep alive type, the sequencer 19 proceeds to another fetch operation at reference numeral 504. If the sequencer atomic is a break type see reference numeral 524, the sequencer 19 pauses the pattern, empties the current vector pipeline, and resets the busy signal flag 434 to indicate to the test site controller 4 that the DUT tester 6 is paused. When the test site controller 4 detects that the DUT tester 6 has requested execution of a routine by polling the bit 15 of the TSC_MISC_RD register 406, the test site controller 4 reads the TSC_PG1 and TSC_PG2 registers 402, 404. The test site controller 4 may use these values as communication codes in any way that the test developer wishes. A beneficial use for these values is to determine which routine the DUT tester 6 requested and what parameters were specified to use for execution of the routine. Because the actual operation is software dependent, this process may be very flexible and may change depending upon the specific application.

As an example, the test developer may use the TSC_PG1 register 402 as a 16-bit register that is logically separated into two fields. Twelve of the 16-bits, a routine field, specify a code for the routine that was requested by the DUT tester 6. Software in the test site controller 4 has a series of if . . . then statements that evaluate the contents of the routine field in the TSC_PG 1 register 402. The test site controller 4 executes a different routine depending upon its value. The remaining 4-bits, a data source field, in the TSC_PG1 register 402 indicates the nature of the contents of the TSC_PG2 register 404. The TSC_PG2 register 404, also 16-bits wide, may either contain direct data that is to be used by the routine specified in the data source field of the TSC_PG1 register 402 or it may contain a pointer for use on whatever source is specified in the data source field. Besides the direct data reflected by a "0000" binary value in the data source field, another possible data source is the scratch pad RAM 312 in the DUT tester 6, reflected by a "0001" binary value in the data source field. The TSC_PG2 register 404 indicates a beginning address value in the scratch pad RAM 312 for parameters that are to be used by the test site controller 4. As one of ordinary skill in the art appreciates, the software may be encoded to recognize any one of a number of possible data sources which can include other memories or registers or some combination of both in the DUT tester 6 or test site controller 4.

Figure 6:
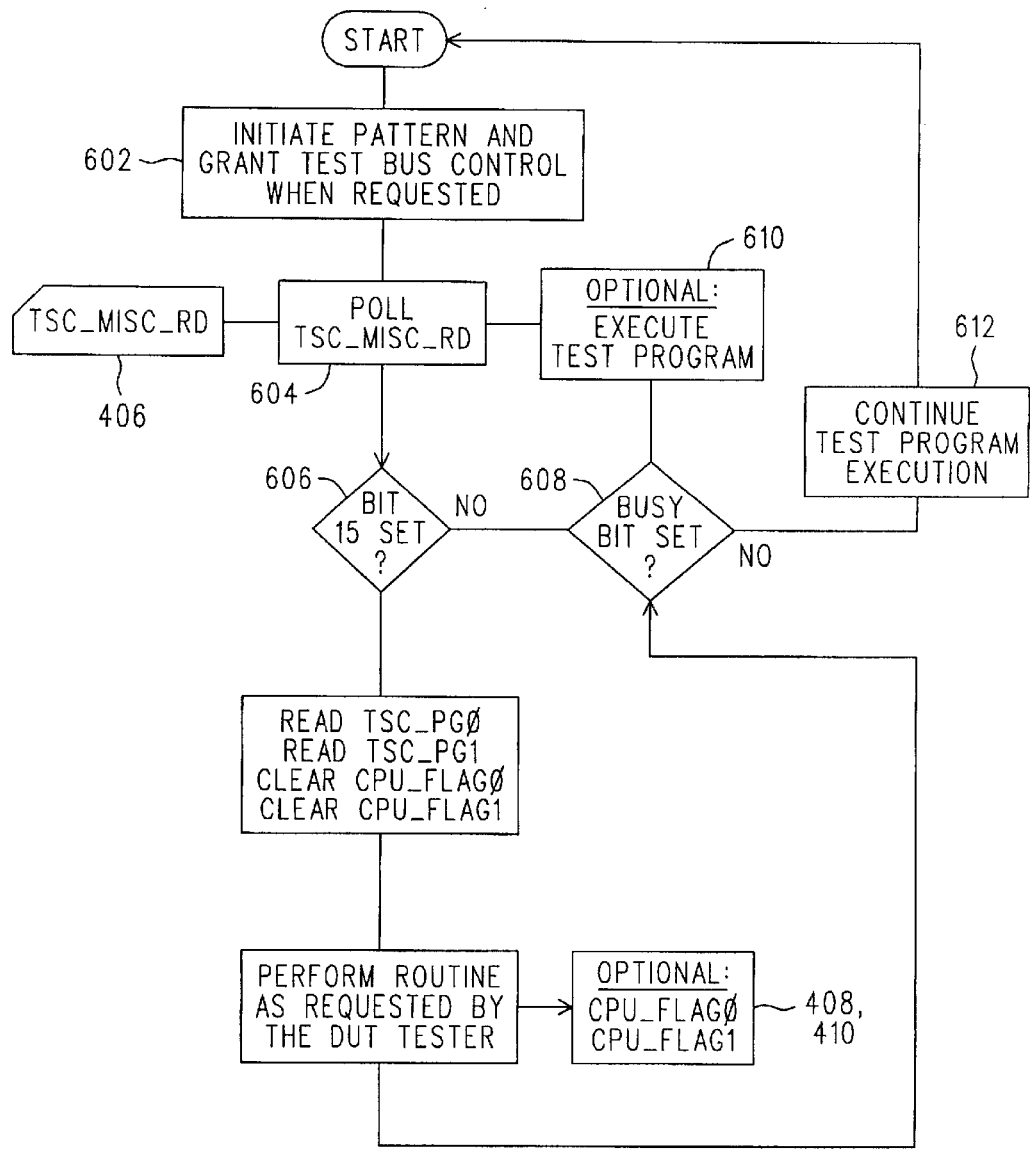
FIG. 6 is a flow chart of a site controller 4 process according to the teachings of the present invention.
Figure 2:
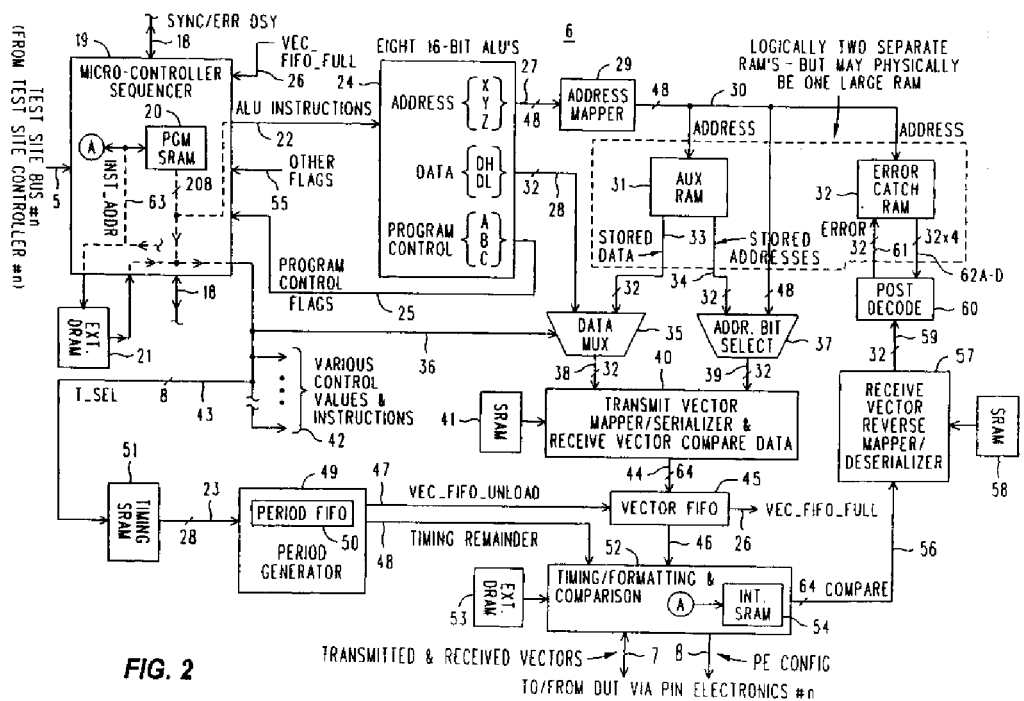
Figure 5:
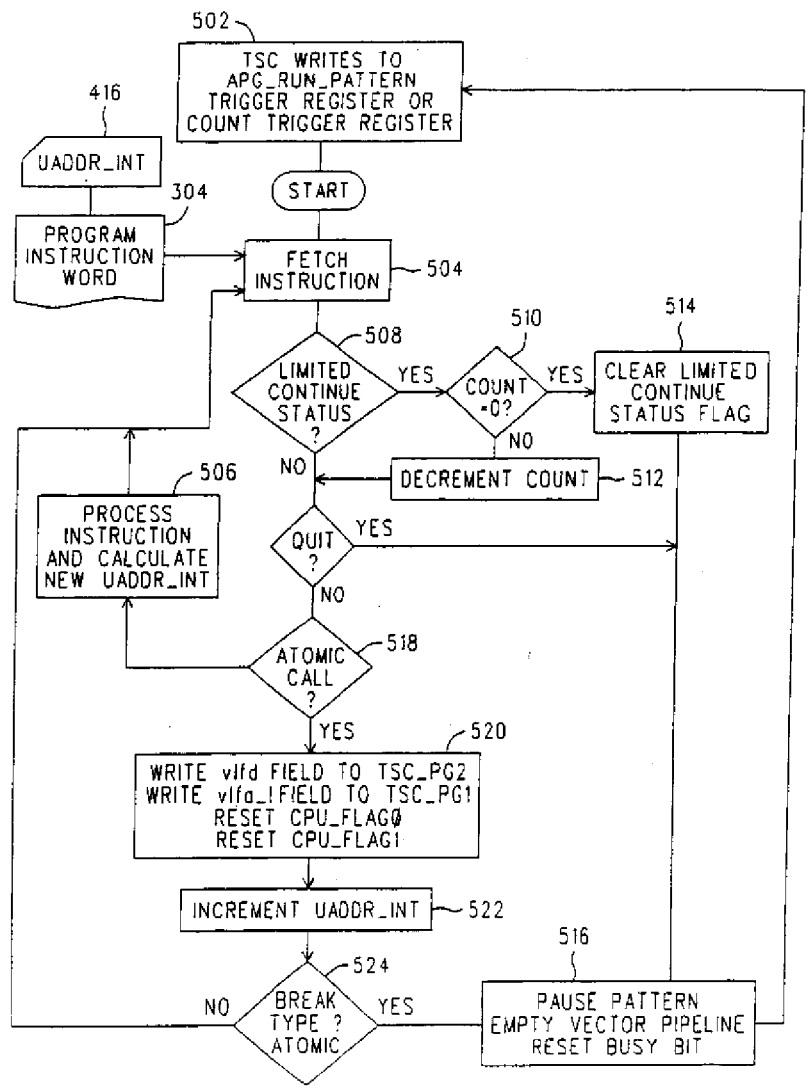

With specific reference to FIG. 6 of the drawings, there is shown a flow chart of a process that may be performed in the test site controller 4. The process begins by initiation of the test pattern in the DUT tester 6. At the beginning of the test pattern execution, the DUT tester 6 requests and the test site controller 4 grants control of the test bus. See reference numeral 602. While the test pattern is executing in the DUT tester 6, the test site controller 4 may either execute tasks independent of the DUT tester 6 or may sit essentially idle waiting for the DUT tester 6 to reach a point that requires action by the test site controller 4. This comprises looping a routine that polls the TSC_MISC_RD register 406 for indications of an atomic call or a DUT tester 6 idle state. See reference numerals 604 and 608. Whether the test site controller also performs tasks within that loop, see reference numeral 610, is up to the test developer. If an atomic is not called, but the DUT tester 6 either completes the test pattern or limited continue, the test site controller 4 performs additional steps in its test program until such time as it is to initiate another test pattern execution. See reference numeral 612. If the bit 15 of the TSC_MISC_RD register 406 is set, and atomic has been called by the DUT tester 6 and the test site controller 4 reads the TSC_PG1 and TSC_PG2 registers 402, 404. Reading those registers clears the CPU_FLAG0 and CPU_FLAG1 registers 408, 410. The test site controller 4 then performs the requested task that is reflected in the TSC_PG1 and TSC_PG2 registers 402, 404. The routine that is performed by the test site controller 4 may set the CPU_FLAG0 and CPU_FLAG1 registers 408, 410 depending upon the results of the routine. The cpu flag0 and cpu flag1 signal lines 428, 430 that reflect the CPU_FLAG0 and CPU_FLAG1 registers 408, 410 may be used by the test pattern in the DUT tester 6 to conditionally branch depending upon their status.

The present disclosure discusses features of the present invention, which are described by way of example. One of ordinary skill in the art appreciates that the present invention may be scaled and adapted without departing from the scope of the claims. The present disclosure is intended to be illustrative and not limitative of the present invention. The scope of the invention is defined solely by the appended claims.

What is claimed is:

1. A method of coordinating program execution in a site controller with test pattern execution in a tester comprising the steps of:
   executing a test pattern in the tester,
   executing a pattern interruption instruction in the tester,
   the tester writing to a service request register in the site controller specifying a requested subroutine and a data source,
   the site controller initiating execution of said requested subroutine in the site controller in response to a value in said service request register.

2. A method as recited in claim 1 and further comprising the step of the site controller alerting the tester of completion of the requested subroutine.

3. A method as recited in claim 2 further comprising the step of resuming execution of said test pattern after said step of alerting.

4. A method as recited in claim 3, said step of resuming further comprising the step of writing a trigger bit to a register.

5. A method as recited in claim 1, said step of executing the test pattern further comprising the steps of addressing a program instruction memory with a value in an address register, retrieving a program instruction from said program instruction memory, and generating a pattern vector from said program instruction, said method further comprising the step of generating a new value for said address register.

6. A method as recited in claim 3 wherein said step of executing said test pattern generates a pipeline of vectors for application to a device under test, the method further comprising the steps of continuing to execute said pipeline of vectors and preventing generation of additional vectors in said pattern.

7. A method as recited in claim 1 and further comprising the step of continuing execution of said pattern simultaneously with said step of initiating execution of said requested subroutine.

8. A method as recited in claim 1 further comprising the step of suspending execution of said pattern after said step of writing to said service request register.

9. A method as recited in claim 1 further comprising the step of restarting execution of a new test pattern.

10. A method as recited in claim 9, said step of restarting execution further comprising the step of writing a trigger bit to a register and a value to an address register.

11. A method as recited in claim 1 and further comprising the steps of checking for a value in a count register, sequentially modifying said count register if said count register does not reflect said value, and pausing said pattern execution if said count register reflects said value.

12. A method as recited in claim 11 wherein said value equals zero and said step of sequentially modifying said count register comprises decrementing said count register if said value in said count register is not equal to zero, and pausing said pattern execution if said value in said count register equals zero.

13. A method as recited in claim 12 and further comprising the steps of continuing administration of the test pattern to completion after said pattern interruption instruction and preventing application of vectors during said step of continuing administration.

14. An apparatus for coordinating program execution comprising
    a site controller executing a routine,
    a tester executing a test pattern,
    a bus interconnecting said site controller and said tester,
    a trigger register in said tester that initiates execution of said test pattern upon a write to said trigger register by said site controller, and
    at least one service request register in said site controller having a value written by said tester that initiates and indicates to said site controller a requested subroutine for execution in said site controller.

15. An apparatus for coordinating program execution as recited in claim 14 wherein said at least one service request register specifies said subroutine from a plurality of available subroutines.

16. An apparatus for coordinating program execution as recited in claim 15 wherein said service request register also specifies a source of data for use by said subroutine.

17. An apparatus for coordinating program execution as recited in claim 16 wherein a second program register specifies a pointer into said source of said data for use by said subroutine.

18. An apparatus for coordinating program execution as recited in claim 17 and further comprising a scratch memory wherein said pointer specifies a location in said scratch memory as said source of said data for use by said subroutine.

19. An apparatus for coordinating program execution as recited in claim 14 and further comprising a second program register that specifies a data parameter for use by said subroutine.

20. An apparatus for coordinating program execution as recited in claim 14 and further comprising an address register in said tester having a value written by said site controller that points to a memory location in which said tester fetches a first instruction for execution of said pattern.

21. An apparatus for coordinating program execution as recited in claim 14 and further comprising a count register in said tester specifying a number of instructions to be executed by said tester.

* * * * *

UNITED STATES PATENT AND TRADEMARK OFFICE
CERTIFICATE OF CORRECTION

PATENT NO. : 6,763,490 B1
DATED : July 13, 2004
INVENTOR(S) : Alan S. Krech, Jr. and John M. Freeseman It is certified that error appears in the above-identified patent and that said Letters Patent is hereby corrected as shown below:

Drawings,
Sheet 2 of 6, Figure 2, on box Vector FIFO, insert above box -- 45 -- and a line pointing to the box as per attached new Fig. 2 on sheet 2 of 6.

Sheet 5 of 6, delete "_____" connecting: QUIT? to box: PROCESS INSTRUCTION AND CALCULATE NEW UADOR_INT and insert -- YES -- on the line going to the right of the QUIT? Instruction and insert -- No -- beside the line going down from the QUIT? Instruction as per attached new Fig. 5 on sheet 5 of 6.

Signed and Sealed this

Twenty-third Day of November, 2004

JON W. DUDAS
*Director of the United States Patent and Trademark Office*